United States Patent [19]

Van Brunt, Jr. et al.

[11] Patent Number: 5,071,357

[45] Date of Patent: Dec. 10, 1991

[54] FLUID PRESSURE ACTUATED ELECTRICAL CONNECTOR

[75] Inventors: Karl B. Van Brunt, Jr., Newark Valley; James R. Petrozello, Endicott, both of N.Y.

[73] Assignee: International Business Machines Corporation, N.Y.

[21] Appl. No.: 510,907

[22] Filed: Apr. 18, 1990

[51] Int. Cl.⁵ .......................................... H01R 13/629
[52] U.S. Cl. ...................................... 439/67; 439/197; 439/260
[58] Field of Search ............... 439/260, 197, 259, 266, 439/267, 592, 593, 67, 77, 492

[56] References Cited

U.S. PATENT DOCUMENTS

| | | | |
|---|---|---|---|
| 2,956,258 | 10/1960 | Raddin | 339/75 |
| 2,978,666 | 4/1961 | McGregor | 339/17 |
| 3,076,166 | 1/1963 | Raddin | 339/17 |
| 3,090,026 | 5/1963 | Raddin | 339/17 |
| 3,366,916 | 1/1968 | Oktay | 339/74 |
| 3,553,021 | 1/1971 | Eberle | 136/82 |
| 3,594,707 | 7/1971 | Peterson | 339/17 L |
| 3,596,228 | 7/1971 | Reed | 439/197 |
| 4,220,389 | 9/1980 | Schell | 339/74 R |
| 4,232,928 | 11/1980 | Wickersham | 339/117 P |
| 4,427,250 | 1/1984 | Hines et al. | 339/75 M |
| 4,428,640 | 1/1984 | Pittman | 439/79 |
| 4,629,270 | 12/1986 | Andrews, Jr. et al. | 439/260 |
| 4,649,339 | 3/1987 | Grangroth et al. | 324/158 F |
| 4,863,395 | 9/1989 | Babuka et al. | 439/260 |

FOREIGN PATENT DOCUMENTS 2495390  6/1982  France ............................. 439/260

OTHER PUBLICATIONS

IBM Technical Disclosure Bulletin vol. 8, No. 4 (9/65), pp. 518, 519 Transmission Line Connector.
IBM TDB vol. 13, No. 9 (02/71), p. 2707 High Capacity Electrical Connector.
IBM TDB vol. 12, No. 9 (02/70), p. 1325, 1326 Zero Insertion Force Pin-To-Pin Connector.
IBM TDB vol. 12, No. 11 (04/70), p. 1741, 1742 Electrical Connector with Cam Action.
IBM TDB vol. 13, No. 11 (04/71), p. 3567 Pneumatic Connector.
IBM TDB vol. 14, No. 10 (03/72), p. 2916 Fluidic Connector.
IBM TDB vol. 20, No. 03 (08/77), p. 977, 978 Zero Insertion Force Pneumatic Pin-to-Pin Connector.
IBM TDB vol. 31, No. 03 (08/88), p. 485, 486 Curved Zero Insertion Force Socket with Hydraulic Actuation.

Primary Examiner—Gary F. Paumen
Assistant Examiner—Kevin J. Carroll
Attorney, Agent, or Firm—Lawrence R. Fraley

[57] ABSTRACT

An electrical connector wherein fluid pressure (pneumatics or hydraulics) is used to actuate an expandable bladder located within the housing of the connector to exert force against two flexible circuit members also located substantially within the connector's housing to cause these members to move toward each other and for highly dense arrays of electrical contacts thereon to engage each other in a predetermined manner. A first alignment means (e.g., pin and corresponding aperture) is used to provide initial alignment of the two flexible circuit members prior to contact being made. One such contact occurs, and the expandable bladder is expanded further, the bladder is able to provide additional alignment for the engaged contacts so as to prevent movement thereof relative to each other. Such precise alignment is critical in highly dense arrays of large numbers of small contacts as required in many of today's information handling systems (computers). In another embodiment of the invention, the two flexible circuit members are actuated to contact arrays of contacts located on the surfaces of a circuit board located within the connector housing between the two flexible circuits. Once connection is initially made, and expansion of the expandable bladders continues, movement of the engaged flexible circuit electrical contacts is substantially prevented, thus assuring precisioned alignment between these contacts in the overall connector assembly. To prevent abrasion of the expandable bladder during actuation thereof, an interface member (e.g., a thin layer of polyimide) is used between the bladder and flexible circuit members, the interface having a smooth, abrasion resistant surface for this purpose.

17 Claims, 4 Drawing Sheets

FLUID PRESSURE ACTUATED ELECTRICAL CONNECTOR

TECHNICAL FIELD

The invention relates to electrical connectors and particularly to such connectors wherein fluid pressure, e.g., pneumatics or hydraulics, is utilized to effect desired electrical connection.

BACKGROUND OF THE INVENTION

The use of fluid pressure in electrical connectors is known, with examples illustrated in U.S. Pat. Nos. 2,956,258, 2,978,666, 3,076,166, 3,090,026, 3,366,916, 3,553,021, 3,594,707, 4,220,389, 4,232,928, 4,427,250 and 4,649,339. Typically, some form of inflatable member or the like is coupled to a suitable hydraulic or pneumatic source which provides liquid or gas to the inflatable member to cause the member to expand or similarly move such that a desired connection or series of connections is effected. See especially U.S. Pat. Nos. 2,978,666, 3,090,026 and 4,220,389 of the above patents for specific examples of this. Thus, the term fluid as used herein is meant to include both gas and liquid applications.

As will be defined in greater detail hereinbelow, the electrical connector of the instant invention is particularly adapted for providing electrical connection between relatively high density arrays of individual electrical contacts located on different circuit members (e.g., flexible circuits) so as to provide interconnection of such circuit members. As also defined below, such interconnection is attained through the use of fluid pressure in such a manner not only to assure that substantially uniform pressure will be applied to each contact but also, significantly, so that precise alignment will be maintained between such high density arrays during said interconnections. Such precise alignment is not possible using the connector schemes described in the aforementioned patents and in many other connectors of the prior art, but is considered critical in order to achieve effective connections in the high density arrays currently demanded in today's technology, e.g., for connecting circuit members used in information processing systems(computers). The connector of the instant invention provides this connection in a new and unique manner. Additionally, the invention is relatively inexpensive to manufacture and operate, and accomplishes the desired connections in a safe and relatively simple manner.

It is believed that such a connector represents a significant advancement in the art.

DISCLOSURE OF THE INVENTION

It is, therefore, a primary object of this invention to enhance the art of electrical connectors by the provision of an electrical connector possessing the capabilities defined herein.

It is another object of the invention to provide such a connector which can be produced in a relatively inexpensive manner and which operates in such a manner.

In accordance with one aspect of the invention, there is provided an electrical connector comprising a housing having first and second internal walls, first and second flexible circuit members being positioned within said housing so that said arrays of electrical contacts on said circuit members are oriented in a facing manner, first alignment means for aligning the first and second flexible circuit members relative to each other, and an expandable bladder located substantially within said housing and including first and second portions in contact with the first and second internal walls of said housing, respectively, the first and second portions of the expandable bladder exerting force against the first and second flexible circuit members, respectively, to cause these circuit members to move toward each other such that the arrays of electrical contacts thereon physically engage one another in a predetermined manner. The expandable bladder is sufficiently resilient during this engagement between the first and second flexible circuit members so as to substantially prevent movement of the electrical contacts relative to each other and thereby provide enhanced alignment of said contacts. The invention further comprises fluid pressure means operatively coupled to the expandable bladder for expanding the bladder to effect the defined engagement between the first and second flexible circuit members.

In accordance with another aspect of the invention, there is provided an electrical connector comprising a housing having first and second internal walls, a circuit board and first and second flexible circuit members for being positioned within the housing so that arrays of electrical contacts on these circuit members are oriented in a facing manner with the circuit board being located therebetween, first alignment means for aligning the first and second flexible circuit members relative to the first and second arrays of contacts on the circuit board, respectively, and an expandable bladder located substantially within the housing and including first and second portions in contact with the first and second internal walls of the housing, respectively, so that these first and second portions of the expandable bladder exerting force against the first and second flexible circuit members, respectively, to cause the circuit members to move toward the circuit board such that the arrays of electrical contacts thereon physically engage the arrays of contacts on the circuit board in a predetermined manner. The expandable bladder is sufficiently resilient during this engagement between the first and second flexible circuit members to substantially prevent movement of the electrical contacts relative to the contacts on the circuit board to thereby provide enhanced alignment of these contacts. The invention further comprises fluid pressure means operatively coupled to the expandable bladder for expanding the bladder to effect the defined engagement between the first and second flexible circuit members and the circuit board.

BEST MODE FOR CARRYING OUT THE INVENTION

For a better understanding of the invention, together with other and further objects, advantages, and capabilities thereof, reference is made to the following disclosure and appended claims in connection with the above-described drawings.

Figure 1:
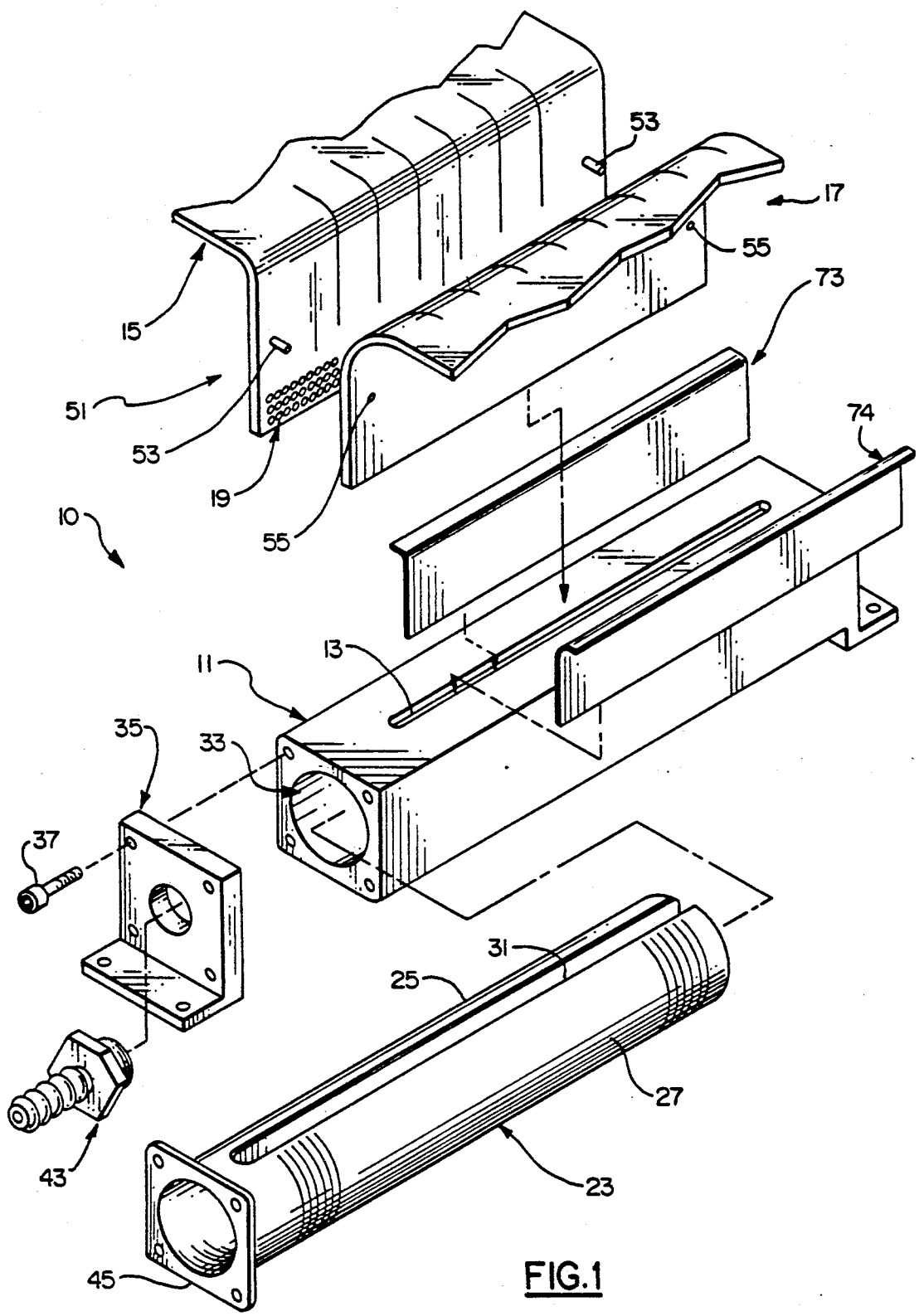
FIG. 1 is an exploded perspective view of an electrical connector in accordance with one embodiment of the invention.

In FIG. 1, there is shown an electrical connector 10 in accordance with one embodiment of the invention. Connector 10 includes a housing 11 having an elongated opening 13 within an upper surface thereof. Housing 11, as shown in FIG. 1, is also of elongated configuration and possesses a substantially boxlike shape (rectangular in cross section). This is not meant to limit the invention, however, in that other shapes (e.g., including cylindrical) are well within the scope of the invention.

It is to be understood that like numerals will be used in different views of the drawings to indicate like parts.

As will be defined herein, connector 10 is particularly adapted for providing sound electrical connection between high density arrays of electrical contacts, and even more particularly, to provide such connection wherein such arrays are located on flexible circuit members. By the term high density as used herein is meant to define electrical contact pads (e.g., copper) of extremely small overall size and spaced in close proximity to one another. For example, such thin contact pads may possess a rectangular configuration with a height (thickness) of only about 0.001 to about 0.002 inch and with side dimensions of only about 0.020 inch by about 0.020 inch, but may even be substantially smaller (e.g., about 0.012 by 0.012 inch). With contacts of this small size, center to center spacings of only about 0.025 inch are preferred. Thus, a total of approximately 1600 contacts may be located on approximately one square inch of the surface of the respective, flexible circuit member. Quite understandably, electrically sound connections between individual contacts in arrays of this density requires substantial precision in order to be effectively achieved. The connector of the instant invention is able to accomplish such connection while also assuring the distinct advantages associated with fluid pressure actuation contact arrangements (e.g. uniformity of force application).

In FIG. 1, two flexible circuit members 15 and 17 are shown with each including an array of highly dense electrical contacts 19 on a lower, facing surface thereof. The contacts are not shown on the second circuit member 17 in FIG. 1 but may be seen in the enlarged sectional views of FIGS. 3-5. When positioned within housing 11 (through the elongated opening 13) both arrays of electrical contacts are brought into physical engagement as a result of actuation of connector 11. This precisely aligned engagement, as defined herein, is made possible through the utilization of an expandable bladder number 23 which, as shown, is of bifurcated configuration to include first and second elongated portions 25 and 27, respectively, which portions serve to define an elongated channel 31 therebetween. Expandable bladder 23 is designed to be inserted within an end 33 of housing 11, afterwhich an end portion 35 of housing 11 is attached (e.g., using screws 37) to secure the bladder in position. An appropriate fluid source 41 (FIG. 2) such as a tank of compressed gas or a pump, is actuated to in turn actuate bladder 23. This actuation will be described in greater detail with the description of FIG. 3.

Figure 2:
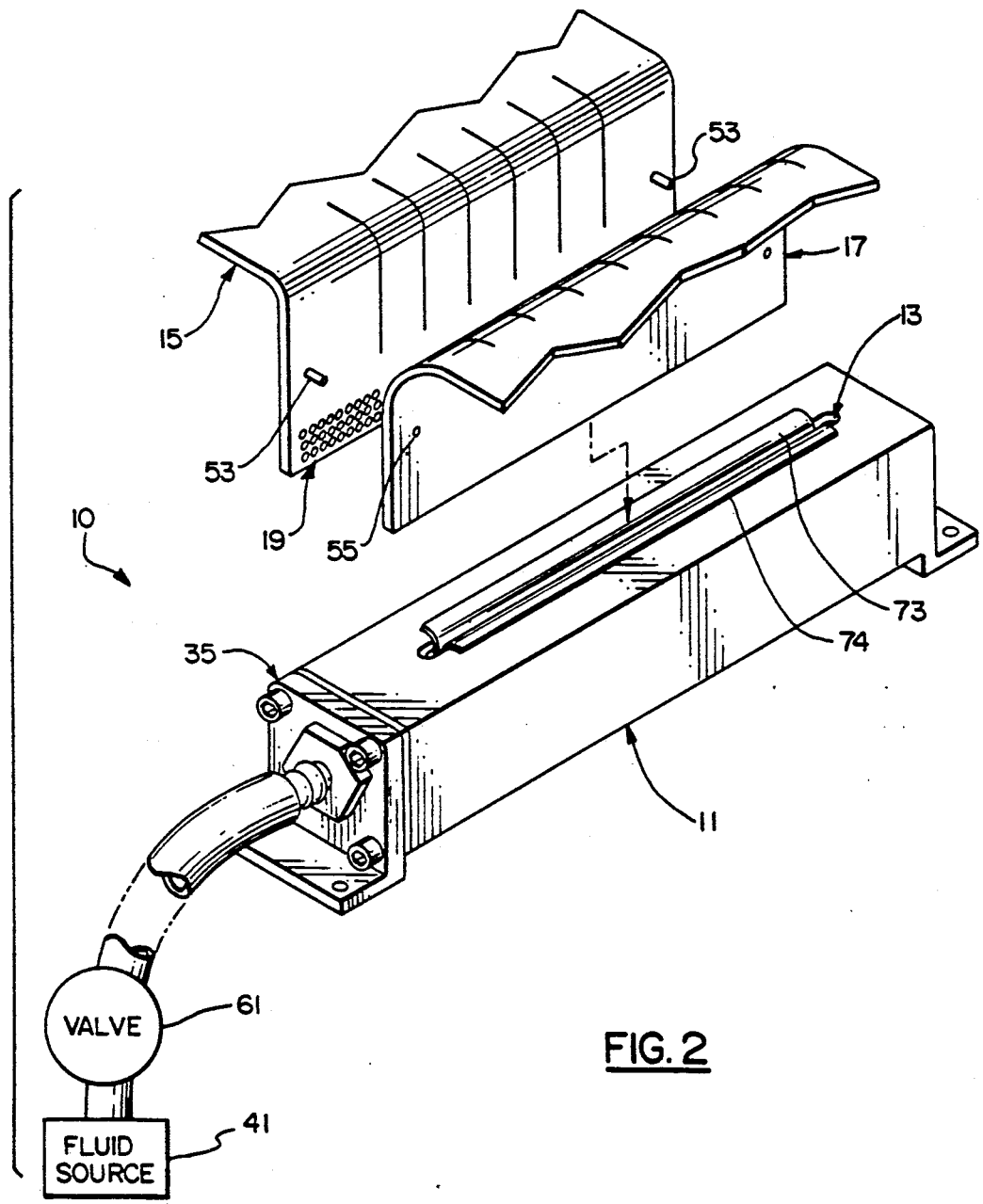
FIG. 2 is a perspective view of the connector in FIG. 1 as assembled, illustrating further the connector as coupled to a suitable fluid source.

Fluid source 41 is operatively connected to bladder 23 through a nipple member 43 which is attached to the housing's end portion 35. Understandably, the flanged end segment 45 of bladder 23 is sealed within housing 11 by the end portion 35 (e.g., using an appropriate sealant). The view in FIG. 2 represents the connector 10 as so assembled prior to insertion of the paired first and second flexible circuit members 15 and 17.

Figure 3:
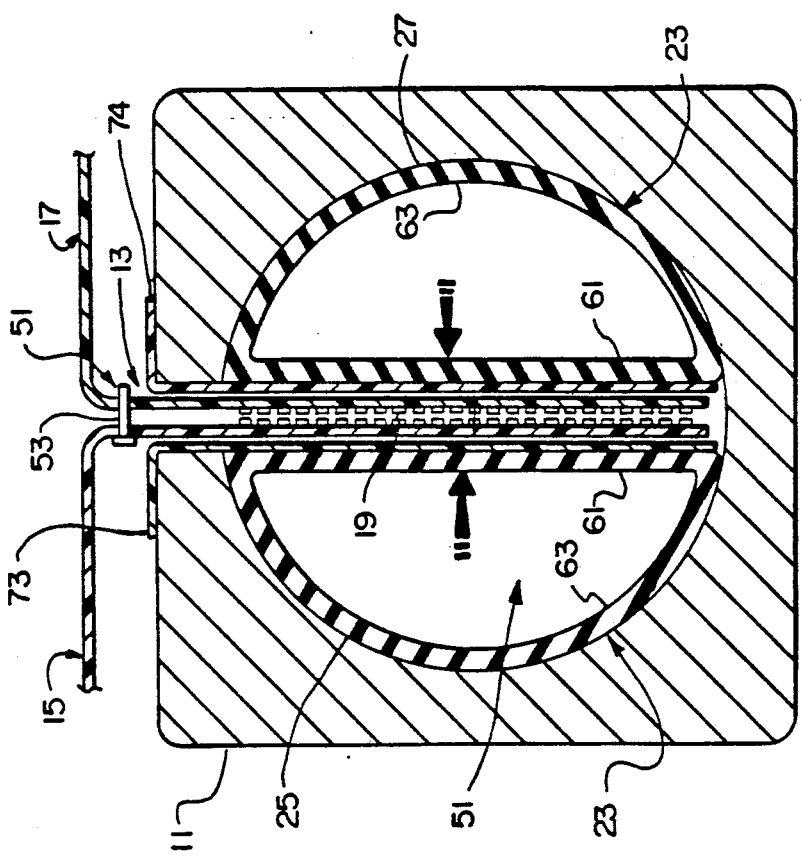
FIG. 3 is a side elevational view, in section and on an enlarged scale, of the assembled connector of FIG. 1 illustrating the various elements therein immediately prior to actuation of the invention's expandable bladder member.

In FIG. 3, the internal arrangement of the various elements of the invention relative to each other can be seen, as well as the location of the two flexible circuit members 15 and 17. Specifically, both circuit members 15 and 17 extend through opening 13 and inwardly to the central chamber (or open) portion 51 of housing 11. Chamber 51 is of substantially annular (cylindrical) configuration and extends substantially the entire length of the elongated boxlike housing. Strategically positioned within this housing is the aforementioned expandable bladder 23 with the two spaced apart portions 25 and 27 oriented so as to lie on opposite sides of the centrally disposed, paired flexible circuit members 15 and 17. Each portion (25, 27) of bladder 23 is of the substantially semicylindrical configuration and includes a substantially linear, interior side 61 and a substantially arcuate (curvilinear) exterior side 63. As shown, each of these curvilinear exterior sides are designed for resting against and engaging a respective, curved internal wall of the containing housing 11. A substantially flush type of engagement is desired at this location of the invention and thus the internal walls of housing 11 possess a substantially similar (curvilinear) configuration to that of the exterior sides 63 of the invention's expandable member 23.

The location of the various elements in FIG. 3 represent the position of these elements immediately prior to actuation of fluid source 41 to effect expansion of bladder 23, resulting in the aforementioned contact between the respective arrays of contacts 19 on first and second flexible circuit members 15, 17. In this orientation, it is seen that a first alignment means 51 is used to provide an initial alignment between both flexible circuit members and particularly the circuitry (electrical contacts) located thereon. In a preferred embodiment of the invention, this first alignment means comprises a pin 53 which is secured to the first flexible circuit member 15 and projects therefrom for aligning with and being inserted within a corresponding aperture 55 located within the second flexible circuit member 17. In the embodiment of the invention as shown in FIGS. 1 and 2, two pins 53 and two corresponding apertures 55 are used, each of these located (in paired relationship) at the approximate ends of the flexible circuit members. It is to be understood that the first alignment means 51 of the invention is designed to provide initial alignment between the two flexible circuit members prior to actuation of expandable bladder 23. As will be defined hereinbelow, the invention further includes another means for maintaining such alignment while in the fully engaged state between respective contact arrays, both means of alignment combining to provide the precise alignment of the invention.

A preferred fluid source for the invention is a container (or tank) of compressed gas, e.g. carbon dioxide. Such represents the preferred embodiment of the invention because relatively high quantities of such gas can be contained within relatively small containers, thus making the connector system described herein readily adaptable for use within many current information handling systems and other apparatus designed to accept and utilize the invention. A preferred liquid which may also be used is a miscible, higher density, higher molecular weight, colorless perfluorinated liquid available under the name Fluorinert (a trademark of the Minnesota Mining and Manufacturing Company). This liquid (one example called FC-77) is preferred because it is noncontaminating (to the electrical contact system) and is substantially noncompressible, thus capable of being loaded to relatively high pressures (e.g., 2500-5000 pounds per square inch). When using such a fluid in connector 10, a one-way check valve 61 is preferably used to prevent reverse fluid escape (from connector 11 back to the designated source 41). A suitable metering unit (not shown) may also be used in the system to operate valve 61 in the event that a droppage of pressure below the prescribed level occurs. In the invention, a preferred fluid pressure within the range of about 50 pounds per square inch to about 100 pounds per square inch is used. This is not meant to limit the invention, however, in that other pressures may be readily used. The aforementioned pressure range is preferred to provide uniform force to the aforedescribed high density arrays of contacts possessing the dimensions stated.

Figure 5:
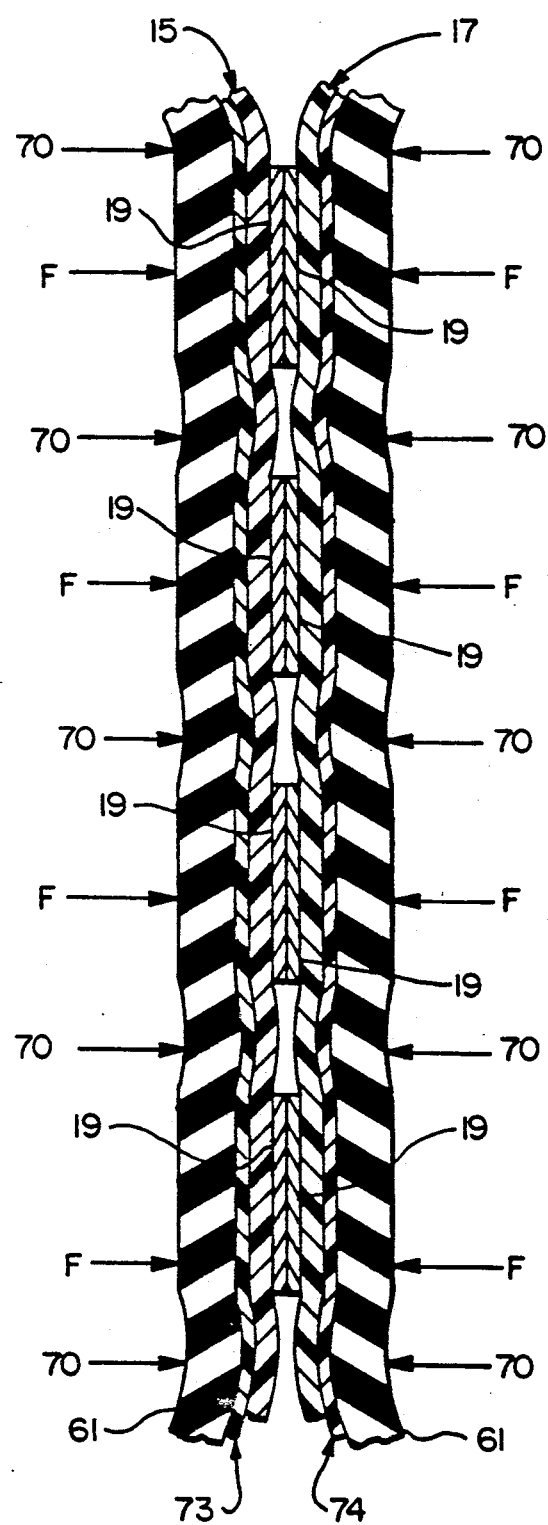
FIG. 5 is a partial elevational view, in section and on an enlarged scale over the view in FIG. 4, illustrating in much greater detail some of the internal elements of the connector of FIG. 1 in an actuated state.

Actuation of source 41 results in expansion of both portions 25 and 27 of bladder 23 such that the linear sidewalls 61 move toward each other (FIG. 3, as indicated by the large arrows) to in turn cause the arrays of contacts 19 to engage. Such engagement is best shown in FIG. 5. FIG. 5 represents a greatly enlarged, partial sectional view of only the linear sides 61 of bladder 23 which cause the defined mating contact between singular electrical contacts 19 of the first flexible circuit member 15 with respective, corresponding singular contacts 19 located on the other, second flexible circuit 17. It is thus seen that these respective paired contact arrangements are made possible by the initial alignment of circuit members 15 and 17 as provided by means 51. With these contacts now in engagement, and with subsequent fluid pressure within bladder 23, the resilient linear sides 61 possess sufficient resilience so as to form arcuate sections 70 therein adjacent each of the respective end segments of each contact 19. Formation of these arcuate sections in turn results in a similar formation formed within the thin dielectric substrate of each flexible circuit member having the contacts thereon. Accordingly, lateral movement (upwardly and/or downwardly in FIG. 5) of the contacts relative to the other in each paired arrangement is substantially prevented. This unique means of maintaining alignment of the contacts is considered essential to assure positive connection between the high density arrays defined herein. As understood, this is made possible by providing linear walls 61 of sufficient resilience and thickness so as to result in formation of the aforementioned arcuate sections.

In FIG. 5, the arrows referenced by the letter "F" represent the application of force to the thin, resilient wall 61. It is understood that in hydraulic or pneumatic fluid pressure actuated systems of the type defined herein, the application of fluid pressure results in a uniform application of force to all internal surfaces of the containing vessel (here, expandable bladder 27). Thus, the invention is able to utilize this uniformity of pressure application to assure sound effective contact between all contacts in the designated arrays while also uniquely maintaining these contacts in relatively fixed relation to each other.

In a preferred embodiment of the invention, each of the flexible circuit members includes a dielectric substrate having a thickness within the range of about 0.002 inch to about 0.005 inch, the preferred material for this substrate being polyimide. The preferred electrical contacts, as stated, are of a copper material or may be comprised of alloys thereof. Preferably, such material is plated with a second metallic material, e.g., gold and/or palladium, for better conductivity and corrosion protection. The expandable bladder 23 as used in this embodiment is preferably comprised of polyurethane or silicon rubber and preferably possesses a sidewall (both walls 61 and 63) thickness within the range of about 0.002 to about 0.020 inch.

Figure 4:
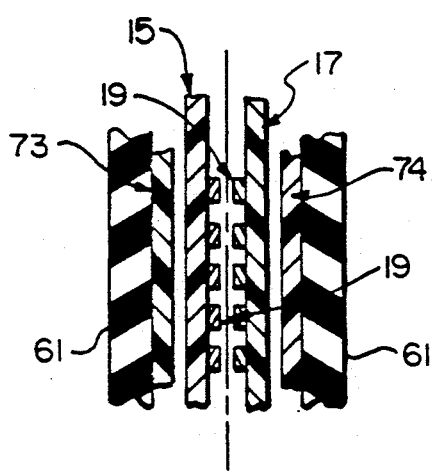
FIG. 4 is a partial elevational view, in section and on an enlarged scale over the view in FIG. 3, illustrating in greater detail some of the internal elements of the connector of FIG. 1.

In order to substantially prevent abrasion occurring on the outer surfaces of each of the linear sides 61 of expandable bladder 23 during actuation thereof, a pair of interface members 73 and 74 are utilized, each of these members being oriented within housing 11 substantially between a respective one of the linear sides 61 and the respective flexible circuit member. This arrangement is best seen in FIGS. 3-5. As shown therein, a first one of these, interface member 73, is located between the linear side 61 of first elongated portion 25 of bladder 23 and the corresponding first flexible circuit member 15. Similarly, interface member 74 is located between the second portion 27 of bladder 23 and the second flexible circuit 17. In operation, each of the expanding linear sides 61 engages a smooth outer surface of this interface member to force it against the back (rear) surface of the respective circuit member. Further expansion of the respective expandable portions 23 eventually causes the two flexible circuits to engage (FIG. 5), afterwhich further expansion of the linear sides 61 occurs until formation of the aforedefined arcuate sections 71 results. As stated, the surface of the relatively thin interface members which engage the expandable bladder portions are smooth to thereby prevent abrasion. A preferred material for the interface members is a polymer (e.g., polyimide) with each member possessing a thickness of only about 0.001 inch. An alternative material also capable of being used is a polymer impregnated with polytetrafluoroethylene (e.g., Teflon, a trademark of E.I. du Pont de Nemours and Company). Significantly, these thin interface members are also sufficiently flexible to promote formation of the arcuate sections adjacent the respective end segments of the engaged contacts. This is best seen in FIG. 5. Such interface members also function as a slip surface between the respective bladder and flexible circuit members to substantially prevent bladder expansion from causing flexible circuit misalignment. As shown in FIG. 3, each of these interface members may be secured to the top surface (that adjacent elongated opening 13) of housing 11 (e.g., using a suitable adhesive). Understandably, polyimide is a known electrically insulative material, but it is understood that each of the interface members 73 and 74 as used herein need not be electrically insulative.

Figure 6:
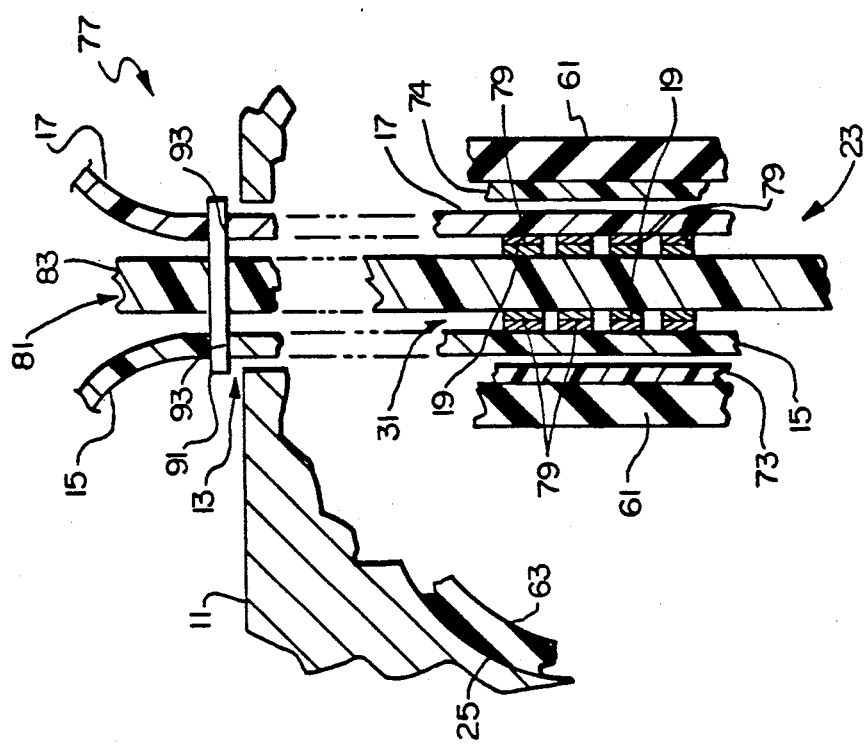
FIG. 6 is a partial elevational view of an electrical connector in accordance with an alternate embodiment of the invention, the connector of FIG. 6 designed to provide electrical connection between at least one (and preferably two) flexible circuit members and another circuit member (e.g., printed circuit board) located within the housing of the connector.

In FIG. 6, there is shown an electrical connector 77 in accordance with another embodiment of the invention. In this embodiment, the aforedefined first and second flexible circuit members 15 and 17 are specifically designed for electrical connecting to contacts 79 located on the opposing surfaces of a circuit board 81. Circuit boards are well known in the art and typically include a dielectric substrate 83 and a plurality of contacts and/or other circuitry on an upper surface thereof. It is understood, as indicated in FIG. 6, that the contacts 19 on each of the flexible circuit members 15 and 17 are designed for mating with and being electrically connected to these outer contacts 79 located on opposite surfaces of the board's dielectric substrate 83.

In operation, the respective flexible circuit members 15 and 17 are initially aligned with respect to board 81 by use of at least one (preferably two) pin 91 which is fixedly located at a predetermined location in the board's substrate 83. If two such pins are used, each should be located in a spaced-apart manner within substrate 83 so as to engage the respective flexible circuits along the outer edges thereof. Such pins are adapted for being inserted within corresponding apertures (93) located within the dielectric substrates of each flexible circuit member. Each of these apertures is strategically positioned relative to the respective contacts 19 located further down on each flexible circuit. Thus, these flexible circuits (and their electrical contacts) are initially aligned with respect to each other as well as to the dielectric substrate 83 of board 81. Thereafter, this assembly is inserted within opening 13 of housing 11 to reside within the channel 31 formed between the respective first and second portions of expandable bladder 23. Once firmly positioned within housing 11, the respective portions of bladder 23 are actuated similarly to bladder 23 in the embodiment of FIG. 1 to cause the linear walls 61 of each portion to move toward each other and thus cause the contacts of flexible circuits 15 and 17 to engage the respective contacts located on board 81. Significantly, precise alignment between the respective arrays of contacts 19 on each flexible circuit and the corresponding respective contacts on the circuit board is maintained in a similar fashion to the maintenance of alignment between contacts 19 in the embodiment of FIG. 1. That is, the respective walls 61 form arcuate sections 70 similarly to those shown in FIG. 5 adjacent each of the respective contacts 19 on the flexible circuit engaging the circuit board. These arcuate sections thus prevent lateral (upward and downward in FIG. 6) movement of these contacts relative to the contacts 79 being engaged, as well as, significantly, the other respective contacts 19 on the remaining flexible circuit member. Thus a dual form of precise alignment is provided by the embodiment of FIG. 6.

Similarly also to the embodiment of FIG. 1, the curvilinear sides 63 (only one shown in FIG. 6) of each portion of bladder 23 engage a respective internal wall within housing 11. Also similarly to the embodiment in FIG. 1, a pair of interface members 74 and 75 are utilized to prevent abrasion on the respective outer surfaces of the expanding portions 25 and 27 of bladder 23. Thus, this embodiment of the invention includes a new and unique means for providing electrical contact between two flexible circuit members and respective circuitry located on opposing outer surfaces of an interim rigid circuit board member in such a manner not only to assure uniform force against each of the contacts being engaged but also so that precise alignment is maintained between these extremely small, highly dense contacting elements. Contact sizes/densities similar to those described above for the embodiment of FIG. 1 may be used.

Thus there has been shown and described an electrical connector which provides electrical connection in one embodiment between two individual circuit members in a new and unique manner. In another embodiment, the connector is designed for providing electrical connection between two such flexible circuit members and an interim circuit board member located therebetween. In both embodiments, an expandable bladder member of bifurcated construction is used to exert the requisite forces necessary against the contacting members not only to assure uniform forces thereon as is necessary in connector arrangements of this type but also to assure that precise alignment between these relatively small elements is maintained. This is accomplished by an expandable bladder which forms restraining means in the form of arcuate sections within one of the engaging sides thereof adjacent the end segments of each contact on the flexible circuit members to thereby restrain these members from lateral movement with respect to the contacts they engage. Such precise connection is attained using relatively low fluid pressure which can be readily obtained from sources known in the art. Similarily, the materials for use with the elements of the invention as defined herein are also readily available to further assure that the invention can be produced in a relatively inexpensive manner. Finally, the invention as defined is of relatively simple but effective construction and is also readily adaptable for incorporation within many of today's connector schemes, including particularly those used in information handling systems.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electrical connector for providing electrical connection between a high density array of electrical contacts located on a first flexible circuit member and a high density array of contacts located on a second flexible circuit member, said connector comprising:

a housing having first and second internal walls, said first and second flexible circuit members being positioned within said housing so that said arrays of electrical contacts on said circuit members are oriented in a facing manner;

first alignment means on said circuit members for providing and maintaining initial alignment between said first and second flexible circuit members relative to each other before and during insertion of said circuit members into said housing;

an expandable bladder located substantially within said housing and including first and second portions in contact with said first and second internal walls of said housing, respectively, said first and second portions of said expandable bladder exerting force against said first and second flexible circuit members, respectively, to cause said circuit members to move toward each other such that said arrays of electrical contacts thereon physically engage one another in a predetermined manner, said expandable bladder being sufficiently resilient during said engagement with said first and second flexible circuit members to substantially prevent lateral wiping movement of said electrical contacts relative to each other and thereby provide enhanced, precise alignment of said contacts, said bladder maintaining said contacts in said precise, non-movable alignment relative to each other; and fluid pressure means operatively coupled to said expandable bladder for expanding said bladder to effect said engagement between said first and second flexible circuit members.

2. The electrical connector according to claim 1 wherein said housing includes an elongated opening therein, said first and second flexible circuit members being located substantially within said opening and extending within said housing.

3. The electrical connector according to claim 2 wherein each of said first and second portions of said expandable bladder is of an elongated configuration and are located within said housing adjacent each other in a spaced-apart manner to thereby define a channel therebetween, said first and second flexible circuits extending within said channel.

4. The electrical connector according to claim 3 wherein each of said first and second portions of said expandable bladder includes a substantially semicylindrical cross-sectional configuration including a substantially linear side and a substantially curvilinear side, said curvilinear side being in contact with said internal wall of said housing.

5. The electrical connector according to claim 4 wherein said substantially linear sides of said first and second portions of said expandable bladder exert said force against said first and second flexible circuit members, respectively, said linear sides forming substantially arcuate sections therein between said electrical contacts when said expandable bladder is expanded to thereby provide said substantial prevention of said lateral wiping movement of said contacts relative to each other and thereby provide said enhanced alignment of said contacts.

6. The electrical connector according to claim 5 wherein the material of said expandable bladder is selected from the group consisting of rubber and polyurethane.

7. The electrical connector according to claim 1 further including a first flexible interface member located between said first flexible circuit member and said first portion of said expandable bladder and a second flexible interface member located between said second flexible circuit and said second portion of said expandable bladder, said first and second portions of said bladder exerting force against said first and second interface members, respectively, which in turn engage said first and second flexible circuit members, respectively.

8. The electrical connector according to claim 7 wherein the surfaces of said flexible interface members which contact said first and second portions of said expandable bladder and said flexible circuit members are sufficiently smooth and abrasion resistant so as to substantially prevent abrasion of said first and second portions of said bladder and misalignment of said flexible circuit members.

9. The electrical connector according to claim 8 wherein the material for said interface members is electrically insulative.

10. The electrical connector according to claim 9 wherein said material for said interface members is a polymer.

11. The electrical connector according to claim 1 wherein said first alignment means for providing said initial alignment between said first and second flexible circuit members comprises at least one pin projecting from one of said flexible circuit members and an aperture within the other of said flexible circuit members, said pin being inserted within said aperture to provide said alignment.

12. The electrical connector according to claim 1 wherein said fluid pressure means provides a gas to said expandable bladder to cause said bladder to expand.

13. The electrical connector according to claim 12 wherein said gas is selected from the group consisting of carbon dioxide and Fluorinert.

14. The electrical connector according to claim 12 wherein said fluid pressure means comprises a cylinder having said gas therein in a compressed state.

15. The electrical connector according to claim 12 further including a one-way valve as part of said fluid pressure means for preventing reverse escape of said gas.

16. The electrical connector according to claim 1 wherein said fluid pressure means provides a liquid to said expandable bladder to cause said bladder to expand.

17. The electrical connector according to claim 16 wherein said liquid is a perfluorinated liquid.

* * * * *